United States Patent
Fu et al.

(10) Patent No.: US 10,672,830 B2
(45) Date of Patent: Jun. 2, 2020

(54) FLEXIBLE LIGHT EMITTING DIODE DISPLAY PANEL AND ELECTRONIC DEVICE

(71) Applicant: SHANGHAI TIANMA MICRO-ELECTRONICS CO., LTD., Shanghai (CN)

(72) Inventors: Jujian Fu, Shanghai (CN); Gang Liu, Shanghai (CN)

(73) Assignee: SHANGHAI TIANMA MICRO-ELECTRONICS CO., LTD., Shanghai (CN)

(*) Notice: Subject to any disclaimer, the term of this patent is extended or adjusted under 35 U.S.C. 154(b) by 0 days.

(21) Appl. No.: 16/219,969

(22) Filed: Dec. 14, 2018

(65) Prior Publication Data

US 2019/0123096 A1 Apr. 25, 2019

(30) Foreign Application Priority Data

Jul. 23, 2018 (CN) .......................... 2018 1 0812163

(51) Int. Cl.
| | |
|---|---|
| H01L 27/15 | (2006.01) |
| G09F 9/30 | (2006.01) |
| H01L 27/12 | (2006.01) |
| H01L 33/62 | (2010.01) |
| H01L 33/38 | (2010.01) |
| H01L 25/075 | (2006.01) |
| H01L 25/16 | (2006.01) |

(52) U.S. Cl.
CPC ............ *H01L 27/156* (2013.01); *G09F 9/301* (2013.01); *H01L 25/0753* (2013.01); *H01L 27/1218* (2013.01); *H01L 33/38* (2013.01); *H01L 33/62* (2013.01); *H01L 25/167* (2013.01)

(58) Field of Classification Search
CPC ... H01L 27/156; H01L 27/1218; H01L 33/62; H01L 33/38; H01L 25/0753; H01L 25/167; H01L 25/075; H01L 25/16; G09F 9/301; G09F 9/30
USPC .......................................... 257/88
See application file for complete search history.

(56) References Cited

U.S. PATENT DOCUMENTS

| | | | |
|---|---|---|---|
| 2015/0076458 A1* | 3/2015 | Lee .......... | H01L 51/56 257/40 |
| 2015/0123098 A1* | 5/2015 | Kang .................. | H01L 51/5253 257/40 |
| 2016/0064464 A1* | 3/2016 | Namkung ........... | H01L 27/1218 257/40 |

(Continued)

FOREIGN PATENT DOCUMENTS

CN 103400918 A 11/2013

*Primary Examiner* — Alexander O Williams
(74) *Attorney, Agent, or Firm* — Kilpatrick Townsend & Stockton, LLP

(57) ABSTRACT

A flexible light emitting diode (LED) display panel and an electronic device are provided. A bonding enhancement structure is arranged in the flexible LED display panel, so that a stress generated by a first electrode structure on a flexible substrate during bending can be reduced, a bonding force between the first electrode structure and the bonding enhancement structure can be enhanced, and thus bonding stability of an LED unit can be improved. The flexible LED display panel is applied in the electronic device, so that the LED unit does not easily peel off, and display effect and service life of the electronic device can be greatly improved.

14 Claims, 7 Drawing Sheets

(56) References Cited

U.S. PATENT DOCUMENTS

| | | | |
|---|---|---|---|
| 2016/0343980 A1* | 11/2016 | Lee | H01L 51/5246 |
| 2017/0077447 A1* | 3/2017 | Kang | H01L 51/5237 |
| 2017/0168203 A1* | 6/2017 | Do | G02B 5/22 |
| 2017/0294425 A1 | 10/2017 | Kim | |
| 2018/0122830 A1* | 5/2018 | Kachatryan | B32B 7/12 |
| 2019/0115370 A1* | 4/2019 | Fu | H01L 27/1222 |
| 2019/0207141 A1* | 7/2019 | Kim | H01L 51/56 |
| 2019/0259822 A1* | 8/2019 | Jeon | H01L 27/3262 |
| 2019/0280246 A1* | 9/2019 | Cheng | H01L 51/52 |
| 2019/0288041 A1* | 9/2019 | Bae | H01L 51/0097 |
| 2019/0385991 A1* | 12/2019 | Kim | H01L 27/15 |
| 2019/0387620 A1* | 12/2019 | Ha | H01L 21/02288 |
| 2020/0020869 A1* | 1/2020 | Kang | H01L 51/56 |

* cited by examiner

FLEXIBLE LIGHT EMITTING DIODE DISPLAY PANEL AND ELECTRONIC DEVICE

The present application claims the priority to Chinese Patent Application No. 201810812163.8, titled "FLEXIBLE LIGHT EMITTING DIODE DISPLAY PANEL AND ELECTRONIC DEVICE", filed on Jul. 23, 2018 with the Chinese Patent Office, which is incorporated herein by reference in its entirety.

FIELD

The present disclosure relates to the field of flexible display, and particularly to a flexible light emitting diode (LED) display panel and an electronic device.

BACKGROUND

The micro-light emitting diode (Micro-LED) technology is a newly-developed display technology. As compared with the existing organic light emitting diode (OLED) or liquid crystal display (LCD) technology, the Micro-LED has advantages of high resolution, high brightness, low power consumption, fast response, high luminous efficiency and long service life, and thus is widely applied in displays such as a mobile phone, a notebook computer and a television.

In the flexible Micro-LED display panel, multiple Micro-LED units are arranged in an array on a flexible substrate by bonding, so as to apply the Micro-LED to the flexible display.

However, in the flexible Micro-LED display panel, the Micro-LED unit may peel off during multiple bending due to a large stress and weak bonding force at a bonding position.

SUMMARY

A flexible LED display panel and an electronic device are provided in the present disclosure, to improve bonding stability of an LED unit.

The flexible LED display panel provided in the present disclosure includes: a flexible substrate; a pixel definition layer arranged on a side of the flexible substrate, including multiple openings arranged in an array; a first electrode structure arranged at the bottom of the multiple openings; and an LED unit arranged on a side of the first electrode structure facing away from the flexible substrate. The LED unit includes a first conductive layer, a semiconductor layer and a second conductive layer stacked in sequence. The first conductive layer is electrically connected to the first electrode structure via a bonding enhancement structure. The bonding enhancement structure is configured to buffer a stress generated by the first electrode structure during bending.

In an embodiment, the bonding enhancement structure is an electrical contact layer. The flexible LED display panel has at least one bending region, and the electrical contact layer in the bending region is provided with hollowed regions.

In an embodiment, the hollowed regions are through holes penetrating through the electrical contact layer.

In an embodiment, the hollowed regions are multiple strip-shaped grooves arranged in parallel. The multiple strip-shaped grooves are arranged to divide the electrical contact layer into multiple electrical contact units arranged in parallel, with the multiple strip-shaped grooves being between adjacent electrical contact units among the multiple electrical contact units.

In an embodiment, the flexible LED display panel has at least one bending region. The bonding enhancement structure in the bending region includes an electrical contact layer and one or more bonding enhancement units. The one or more bonding enhancement units are configured to buffer a stress generated by the first electrode structure during bending.

In an embodiment, the bonding enhancement units are arranged on two sides of the electrical contact layer, and the electrical contact layer is an integral structure.

In an embodiment, the bonding enhancement units are arranged on two sides of the electrical contact layer, and the electrical contact layer is provided with through holes penetrating through the electrical contact layer.

In an embodiment, the electrical contact layer is provided with multiple strip-shaped grooves arranged in parallel. The multiple strip-shaped grooves are arranged to divide the electrical contact layer into multiple electrical contact units arranged in parallel, with the multiple strip-shaped grooves being between adjacent electrical contact units among the multiple electrical contact units.

In an embodiment, the bonding enhancement units are arranged on two sides of the electrical contact layer, and an extension direction of each of the multiple strip-shaped grooves is perpendicular to a direction in which the bonding enhancement units are relatively arranged.

In an embodiment, the bonding enhancement units are arranged in the multiple strip-shaped grooves, with at least one of the multiple electrical contact units being between adjacent bonding enhancement units among the bonding enhancement units.

In an embodiment, the bonding enhancement units are arranged in the multiple strip-shaped grooves, with one of the multiple electrical contact units being between adjacent bonding enhancement units among the bonding enhancement units.

In an embodiment, the bonding enhancement units located between the pixel definition layer and the electrical contact layer cover a side wall of the first electrode structure in a direction perpendicular to the flexible substrate.

In an embodiment, the electrical contact layer is made of a material which is the same as that of the first electrode structure.

In an embodiment, the bonding enhancement units are made of non-conductive materials. The bonding enhancement units are made of an organic material or a high molecular polymer material.

In an embodiment, in a direction perpendicular to the flexible substrate, an area covered by the bonding enhancement structure is the same as an area covered by the first electrode structure.

In an embodiment, the flexible LED display panel further includes a filling layer filling the multiple openings, with the filling layer exposing the second conductive layer.

In an embodiment, the flexible LED display panel further includes a second electrode structure electrically connected to the second conductive layer.

In an embodiment, the flexible LED display panel further includes an array layer arranged between the flexible substrate and the pixel definition layer. The array layer includes multiple thin film transistors arranged in an array. In a direction perpendicular to the flexible substrate, the multiple openings are arranged opposite to the multiple thin film transistors, respectively.

In an embodiment, the flexible LED display panel further includes a buffer layer arranged between the flexible substrate and the array layer.

In an embodiment, each of the multiple thin film transistors includes an active layer, a gate, a source and a drain, with the source and the drain being located on a same layer. The array layer further includes a gate insulating layer, an inter-layer insulating layer, a passivation layer and a planarization layer. The gate insulating layer is arranged between the active layer and the gate. The inter-layer insulating layer is arranged between the gate and the layer on which the source and the drain are located. The passivation layer is arranged on a side of the source and the drain facing away from the inter-layer insulating layer. The planarization layer is arranged on a side of the passivation layer facing away from the inter-layer insulating layer.

The electronic device provided in the present disclosure includes the flexible LED display panel described above.

It can be seen from the above description that, the bonding enhancement structure is arranged in the flexible LED display panel provided in the present disclosure, so that the stress generated by the first electrode structure on the flexible substrate during bending can be reduced, the bonding force between the first electrode structure and the bonding enhancement structure can be enhanced, and thus the bonding stability of the LED unit can be improved.

The flexible LED display panel is applied in the electronic device, so that the LED unit does not easily peel off, and the display effect and service life of the electronic device can be greatly improved.

BRIEF DESCRIPTION OF THE DRAWINGS

Embodiments of the present disclosure are described in, the drawings to be used in the description of the embodiments which are briefly described below. Apparently, the drawings in the following description show only some embodiments of the present disclosure.

DETAILED DESCRIPTION OF THE EMBODIMENTS

Embodiments of the present disclosure are described clearly and completely in conjunction with the drawings in the embodiments of the present disclosure hereinafter. It is apparent that the described embodiments are only some embodiments of the present disclosure, rather than all embodiments.

Figure 1:
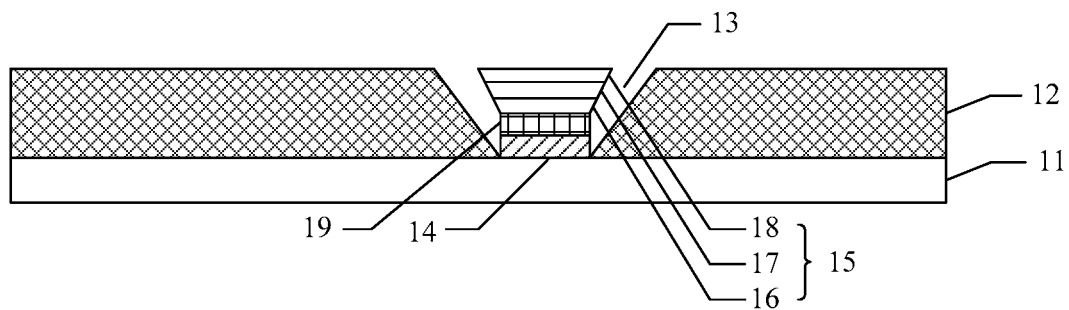
FIG. 1 is a schematic sectional view of a flexible LED display panel according to an embodiment of the present disclosure.

Reference is made to FIG. 1, which is a schematic sectional view of a flexible LED display panel according to an embodiment of the present disclosure. The flexible LED display panel includes a flexible substrate 11 and a pixel definition layer 12 arranged on a side of the flexible substrate 11. The pixel definition layer 12 includes multiple openings 13 arranged in an array. The flexible LED display panel further includes a first electrode structure 14 arranged at the bottom of the multiple openings 13.

The flexible LED display panel further includes an LED unit 15 arranged on a side of the first electrode structure 14 facing away from the flexible substrate 11. The LED unit 15 includes a first conductive layer 16, a semiconductor layer 17, and a second conductive layer 18 stacked in sequence.

The first conductive layer 16 is electrically connected to the first electrode structure 14 via a bonding enhancement structure 19.

The bonding enhancement structure 19 is configured to buffer a stress generated by the first electrode structure 14 during bending.

Figure 2:
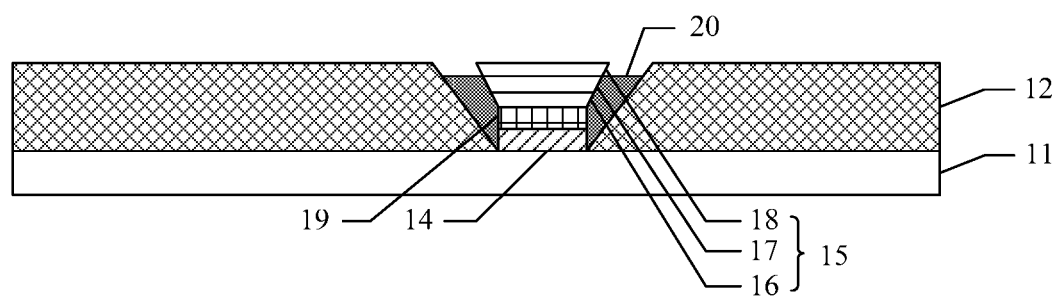
FIG. 2 is a schematic sectional view of a flexible LED display panel according to another embodiment of the present disclosure.

Further, reference is made to FIG. 2, which is a schematic sectional view of a flexible LED display panel according to another embodiment of the present disclosure. The flexible LED display panel further includes a filling layer 20 filling the multiple openings 13, with the filling layer 20 exposing the second conductive layer 18.

The filling layer 20 is provided to secure the LED unit 15, to prevent the LED unit 15 from moving.

Figure 3:
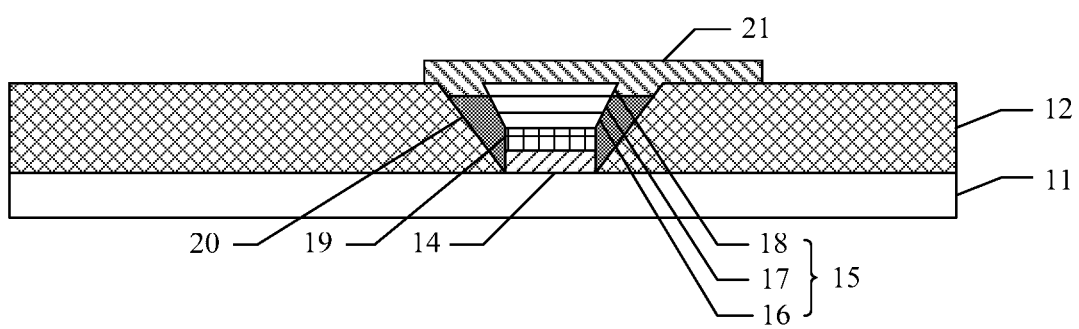
FIG. 3 is a schematic sectional view of a flexible LED display panel according to another embodiment of the present disclosure.

Further, reference is made to FIG. 3, which is a schematic sectional view of a flexible LED display panel according to another embodiment of the present disclosure. The flexible LED display panel further includes a second electrode structure 21 electrically connected to the second conductive layer 18.

The second electrode structure 21 covers a surface of the second conductive layer 18 facing away from the first conductive layer 16 and a side wall of the second conductive layer 18.

In an embodiment, in a direction perpendicular to the flexible substrate 11, an area covered by the bonding enhancement structure 19 is the same as an area covered by the first electrode structure 14.

Figure 4:
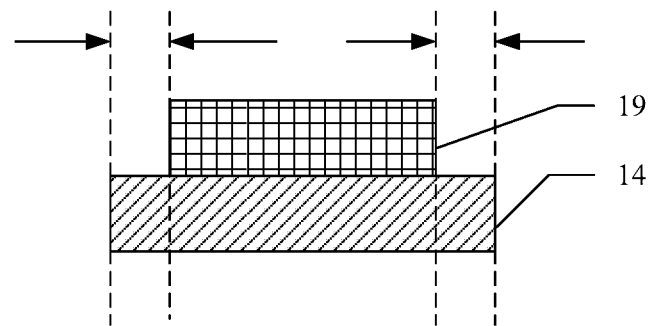
FIG. 4 is a schematic structural view showing a bonding enhancement structure and a first electrode structure according to an embodiment of the present disclosure.

In an embodiment, reference is made to FIG. 4, which is a schematic structural view showing a bonding enhancement structure and a first electrode structure according to an embodiment of the present disclosure. If there is a gap between the bonding enhancement structure 19 and the first electrode structure 14, as indicated by an arrow shown in FIG. 4, the bonding enhancement structure 19 easily peels off from the first electrode structure 14 due to the gap during bending.

Figure 5:
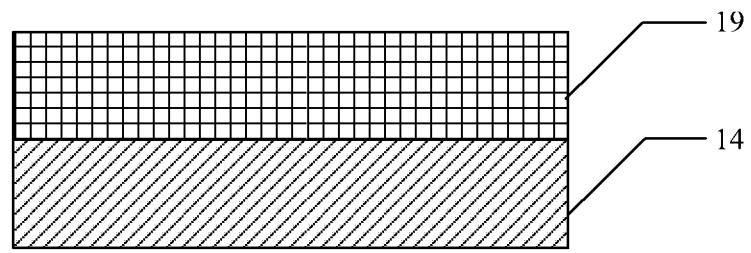
FIG. 5 is a schematic structural view showing a bonding enhancement structure and a first electrode structure according to another embodiment of the present disclosure.

In another embodiment, reference is made to FIG. 5, which is a schematic structural view showing a bonding enhancement structure and a first electrode structure according to another embodiment of the present disclosure. The bonding enhancement structure 19 is bonded with an edge of the first electrode structure 14, such that no gap exists as much as possible. However, due to limitation of the process, the gap cannot be eliminated. In this case, a width of the gap should be less than or equal to 5 μm.

In an embodiment, the flexible substrate 11 is made of a flexible insulating material that is stretchable, bendable or curvable, including but not limited to a polyimide (which is referred to as "PI") material, a polycarbonate (which is referred to as "PC") material, and a polyethylene terephthalate (which is referred to as "PET") material.

It should be noted that the pixel definition layer 12 has a multi-layer structure in FIG. 1, which is not described in detail herein. In addition, in FIG. 1, the description is made by taking only one opening as an example.

It can be seen from the above description that, the bonding enhancement structure 19 is provided in the flexible LED display panel, so as to reduce a stress generated by the first electrode structure 14 arranged on the flexible substrate 11 during bending, and thus enhance bonding stability of the LED unit 15.

Figure 6:
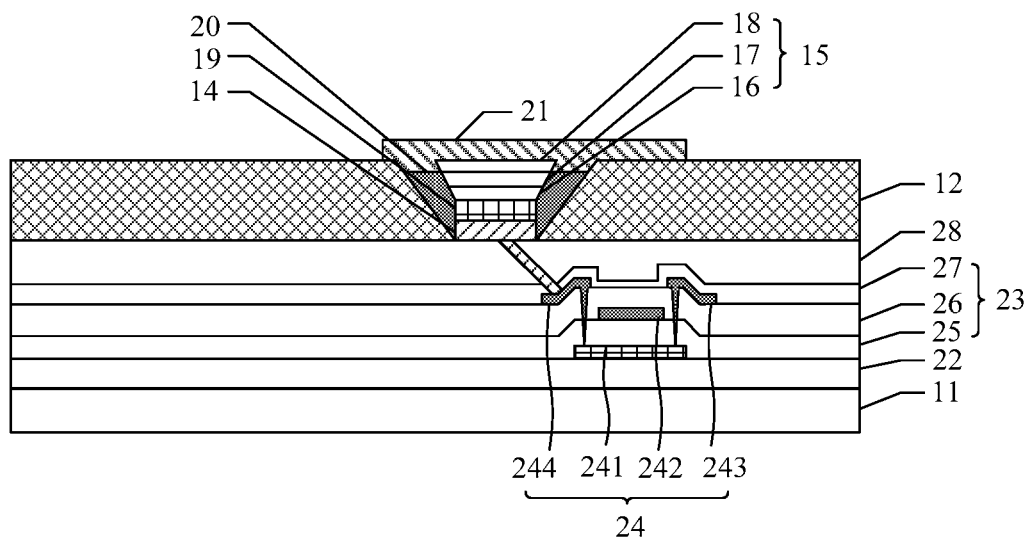
FIG. 6 is a schematic sectional view of a flexible LED display panel according to another embodiment of the present disclosure.

Further, reference is made to FIG. 6, which is a schematic sectional view of a flexible LED display panel according to another embodiment of the present disclosure. The flexible LED display panel further includes an array layer 23 arranged between the flexible substrate 11 and the pixel definition layer 12.

The array layer 23 includes but is not limited to multiple thin film transistors 24 arranged in an array. In a direction perpendicular to the flexible substrate 11, the multiple openings 13 are arranged opposite to the multiple thin film transistors 24, respectively.

Further, as illustrated in FIG. 6, the flexible LED display panel further includes a buffer layer 22 arranged between the flexible substrate 11 and the array layer 23.

In an embodiment, the buffer layer 22 includes but is not limited to an inorganic material layer or an organic material layer. The inorganic material layer may be made of materials including but not limited to silicon oxide, silicon nitride, silicon oxynitride, aluminum oxide or aluminum nitride. The organic material layer may be made of materials including but not limited to acryl or PI.

Each of the multiple thin film transistors 24 includes an active layer 241, a gate 242, a source 243, and a drain 244. The source 243 and the drain 244 are located on a same layer. The array layer 23 further includes: a gate insulating layer 25 arranged between the active layer 241 and the gate 242; an inter-layer insulating layer 26 arranged between the gate 242 and the layer on which the source 243 and the drain 244 are located; a passivation layer 27 arranged on a side of the source 243 and the drain 244 facing away from the inter-layer insulating layer 26; and a planarization layer 28 arranged on a side of the passivation layer 27 facing away from the inter-layer insulating layer 26.

It should be noted that the pixel definition layer 12 has a multi-layer structure in FIG. 6, which is not described in detail herein, In addition, in FIG. 6, the description is made by taking only one thin film transistor 24 as an example.

It should be noted that the thin film transistor 24 may be a P-type thin film transistor or an N-type thin film transistor. In this embodiment, the description is made by taking a P-type thin film transistor as an example.

In a case that the thin film transistor 24 is a P-type thin film transistor, the first electrode structure 14 is connected to a drain of the P-type thin film transistor.

In a case that the thin film transistor 24 is an N-type thin film transistor, the first electrode structure 14 is connected to a source of the N-type thin film transistor.

A specific connection between the first electrode structure 14 and the thin film transistor 24 is illustrated in FIG. 6. Further, a through hole is formed by etching the planarization layer 28 and the passivation layer 27, to expose an electrode terminal of the thin film transistor 24 corresponding to the first electrode structure 14, so as to electrically connect the first electrode structure 14 with the electrode terminal of the thin film transistor 24.

It can be seen from the above description that, in the conventional technology, the first electrode structure 14 generates a great stress during multiple bending, which causes the LED unit to peel off. In view of this, a bonding enhancement structure 19 is arranged between the first conductive layer 16 and the first electrode structure 14 in the present disclosure, to electrically connect the first conductive layer 16 with the first electrode structure 14, so as to reduce the stress generated by the first electrode structure 14 during bending, and thus enhance the bonding stability of the LED unit 15.

Figure 7:
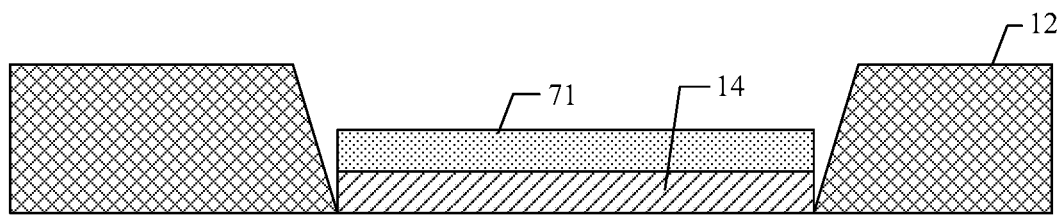
FIG. 7 is a schematic structural view of a bonding enhancement structure according to an embodiment of the present disclosure.

Further, reference is made to FIG. 7, which is a schematic structural view of a bonding enhancement structure according to an embodiment of the present disclosure. The bonding enhancement structure is an electrical contact layer 71.

The flexible LED display panel has at least one bending region. The electrical contact layer 71 in the bending region is provided with hollowed regions.

Since the stress is mainly generated at an edge of a contact surface between the electrical contact layer 71 and the first electrode structure 14 during bending, the electrical contact layer 71 is provided with the hollowed regions. In this way, the stress is buffered into the hollowed regions during bending, so as to prevent the electrical contact layer 71 from peeling off from the first electrode structure 14 due to the bending.

Figure 8:
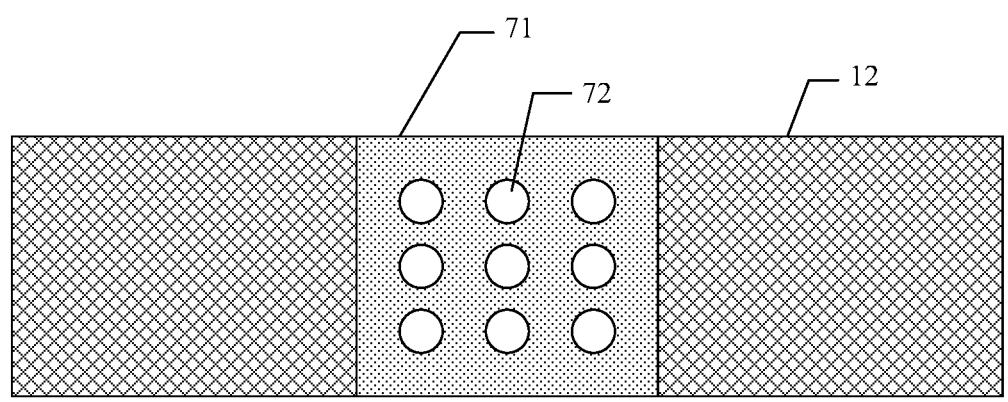
FIG. 8 is a schematic top view showing a case that a hollowed region is a through hole according to an embodiment of the present disclosure.

In an embodiment, reference is made to FIG. 8, which is a schematic top view showing a case that a hollowed region is a through hole according to an embodiment of the present disclosure. The hollowed region includes but is not limited to a through hole 72 penetrating through the electrical contact layer 71.

Figure 9:
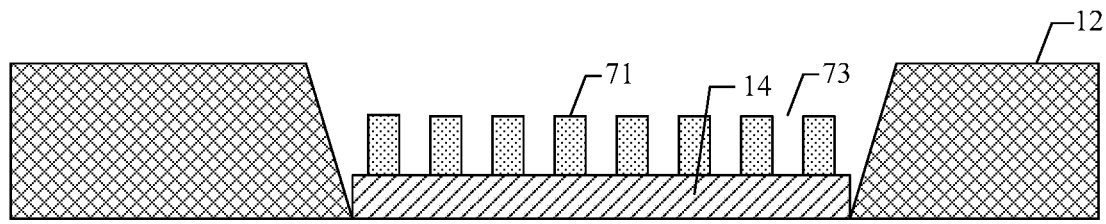
FIG. 9 is a schematic sectional view showing a case that a hollowed region is a strip-shaped groove according to an embodiment of the present disclosure.

In another embodiment, reference is made to FIG. 9, which is a schematic sectional view showing a case that a hollowed region is a strip-shaped groove according to an embodiment of the present disclosure. The hollowed regions are multiple strip-shaped grooves 73 arranged in parallel. The strip-shaped grooves 73 are arranged to divide the electrical contact layer 71 into multiple electrical contact units arranged in parallel, with the strip-shaped grooves 73 being between adjacent electrical contact units.

It should be noted that an extension direction of each of the strip-shaped grooves 73 is parallel to a direction of a bending axis of the flexible LED display panel.

It should be noted that the bending axis in this embodiment is not an entity structure, but refers to an axis in which the bending region is folded, i.e., an axis for guiding a direction of bending. That is, a path of the fold for bending is consistent with an extension direction of the bending axis.

It should be noted that both the through hole 72 and the strip-shaped groove 73 may have various shapes, which may be designed based on a direction of the stress to buffer the stress.

It should be noted that the electrical contact layer 71 is required to be etched to form the through holes 72 or the strip-shaped grooves 73, which increases the process complexity. Therefore, in the present disclosure, the electrical contact layer 71 in the bending region may be etched as described above, and the electrical contact layer in the non-bending region is a one-piece electrical contact layer.

It can be seen from the above description that, in the conventional technology, a complete electrical contact layer 71 is generally arranged between the first conductive layer 16 and the first electrode structure 14. In this case, the first electrode structure 14 generates a great stress during multiple bending, which causes the electrical contact layer 71 to peel off from the first electrode structure 14. In view of this, an electrical contact layer 71 having through holes 72 or strip-shaped grooves 73 is arranged between the first conductive layer 16 and the first electrode structure 14 in the present disclosure, to electrically connect the first conductive layer 16 with the first electrode structure 14, so as to reduce the stress generated by the first electrode structure 14 during bending, and thus enhance the bonding stability of the LED unit.

Figure 10:
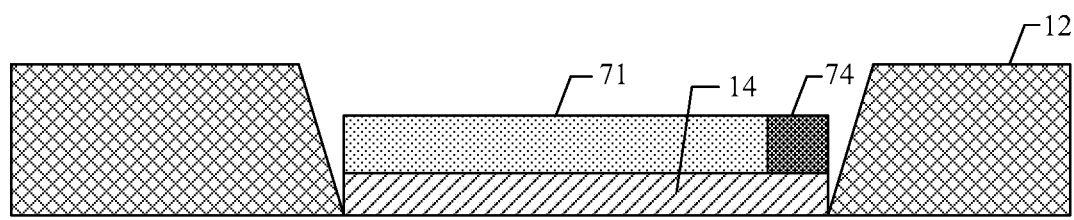
FIG. 10 is a schematic structural view of a bonding enhancement structure according to another embodiment of the present disclosure.

Further, reference is made to FIG. 10, which is a schematic structural view of a bonding enhancement structure according to another embodiment of the present disclosure. The flexible LED display panel has at least one bending region. The bonding enhancement structure in the bending region includes an electrical contact layer 71 and one or more bonding enhancement units 74.

The bonding enhancement units 74 are configured to buffer a stress generated by the first electrode structure 14 during bending.

Each of the bonding enhancement units 74 may be made of a conductor material, a semiconductor material, or a non-conductive material. For example, the bonding enhancement unit 74 is made of an organic material or a high molecular polymer material having good flexibility and strong bonding with a metal material.

In an embodiment, the bonding enhancement unit 74 is made of a conductor material having better flexibility than the electrical contact layer 71, which also has conductivity while having good flexibility.

It can be seen from the above description that, with the bonding enhancement unit 74 having good flexibility and strong bonding with a metal material in the present disclosure, the stress generated by the first electrode structure 14 during bending can be buffered, thereby enhancing the bonding stability between the first electrode structure 14 and the bonding enhancement structure 19.

Figure 11:
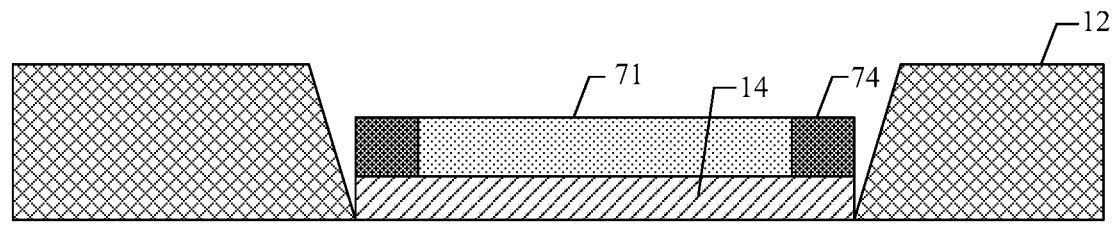
FIG. 11 is a schematic structural view of a bonding enhancement structure according to another embodiment of the present disclosure.

Further, reference is made to FIG. 11, which is a schematic structural view of a bonding enhancement structure according to another embodiment of the present disclosure. The bonding enhancement units 74 are arranged on two sides of the electrical contact layer 71, and the electrical contact layer 71 is an integral structure.

Based on the conventional structure, the bonding enhancement units 74 are arranged on two sides of the electrical contact layer 71, where the two sides of the electrical contact layer 71 are parallel to the direction of the bending axis.

It should be noted that the bending axis in this embodiment is not an entity structure, but refers to an axis in which the bending region is folded, i.e., an axis for guiding a direction of bending. That is, a path of the fold for bending is consistent with an extension direction of the bending axis.

It can be seen from the above description that, the bonding stability between the LED unit 15 and the first electrode structure 14 can be enhanced by arranging the bonding enhancement units 74 based on the conventional structure, which is simple and does not increase complexity of the overall structure.

Figure 12:
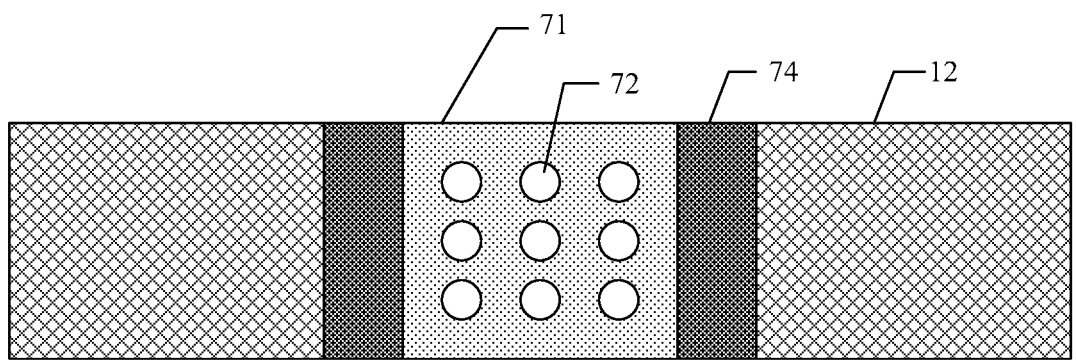
FIG. 12 is a schematic top view of a bonding enhancement structure according to another embodiment of the present disclosure.

Further, reference is made to FIG. 12, which is a schematic top view of a bonding enhancement structure according to another embodiment of the present disclosure. The bonding enhancement units 74 are arranged on two sides of the electrical contact layer 71, and the electrical contact layer 71 is provided with through holes 72 penetrating through the electrical contact layer 71.

The electrical contact layer 71 is provided with the through holes 72, which buffers the stress to some extent and indirectly enhances the bonding stability between the LED unit 15 and the first electrode structure 14, but does not minimize the risk of peeling off. Further, the bonding enhancement units 74 are arranged on two sides of only a complete electrical contact layer 71, which indirectly enhances the bonding stability between the LED unit 15 and the first electrode structure 14 due to the flexibility, but does not minimize the risk of peeling off.

Based on the above, the bonding enhancement units 74 are arranged on two sides of the electrical contact layer 71 having the through holes 72 in the present disclosure. In this way, the bonding stability between the LED unit 15 and the first electrode structure 14 can be greatly enhanced, and the risk of peeling off can be minimized.

Figure 13:
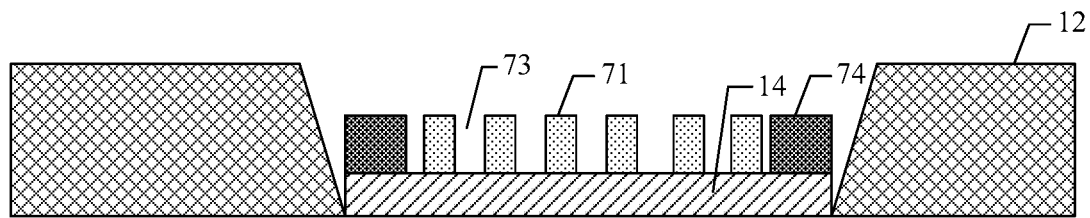
FIG. 13 is a schematic structural view of a bonding enhancement structure according to another embodiment of the present disclosure.

Further, reference is made to FIG. 13, which is a schematic structural view of a bonding enhancement structure according to another embodiment of the present disclosure. The electrical contact layer 71 is provided with multiple strip-shaped grooves 73 arranged in parallel. The strip-shaped grooves 73 are arranged to divide the electrical contact layer 71 into multiple electrical contact units arranged in parallel, with the strip-shaped grooves 73 being between adjacent electrical contact units. The bonding enhancement units 74 are arranged on two sides of the electrical contact layer 71, and an extension direction of each of the strip-shaped grooves 73 is perpendicular to a direction in which the bonding enhancement units 74 are relatively arranged.

The extension direction of each of the strip-shaped grooves 73 is parallel to a direction of a bending axis of the flexible LED display panel.

The electrical contact layer 71 is provided with the strip-shaped grooves 73 structures, which buffers the stress to some extent and indirectly enhances the bonding stability between the LED unit 15 and the first electrode structure 14, but does not minimize the risk of peeling off.

Based on this, the bonding enhancement units 74 are arranged on two sides of the electrical contact layer 71 having the strip-shaped grooves 73 in the present disclosure. In this way, the bonding stability between the LED unit 15 and the first electrode structure 14 can be greatly enhanced, and the risk of falling peeling off can be minimized.

Figure 14:
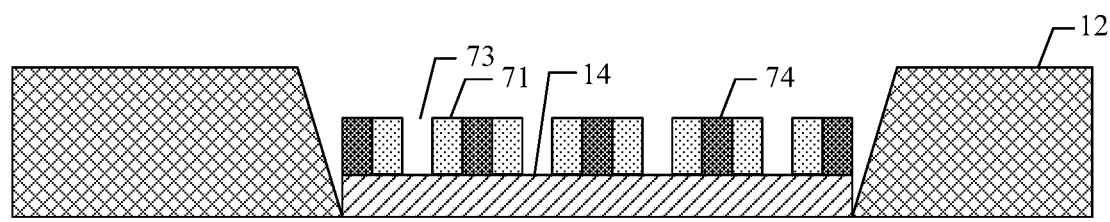
FIG. 14 is a schematic structural view of a bonding enhancement structure according to another embodiment of the present disclosure.

Further, reference is made to FIG. 14, which is a schematic structural view of a bonding enhancement structure according to another embodiment of the present disclosure. The bonding enhancement units 74 are arranged in the strip-shaped grooves 73, with at least one of the electrical contact units being between adjacent bonding enhancement units 74.

Figure 15:
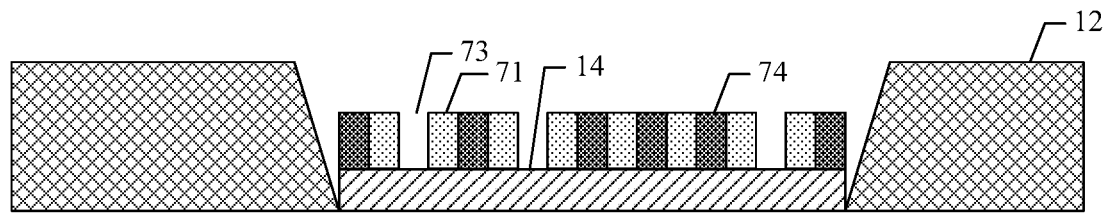
FIG. 15 is a schematic structural view of a bonding enhancement structure according to another embodiment of the present disclosure.

As illustrated in FIG. 14, there are two electrical contact units between adjacent bonding enhancement units 74. In one embodiment, as illustrated in FIG. 15, which is a schematic structural view of a bonding enhancement structure according to another embodiment of the present disclosure, there are two electrical contact units between some of adjacent bonding enhancement units 74, and there is one electrical contact unit between some adjacent bonding enhancement units 74.

Figure 16:
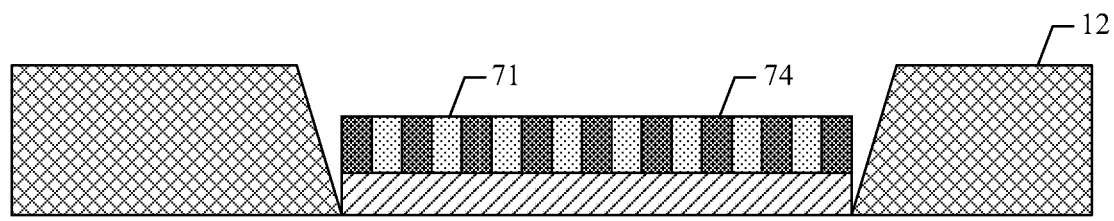
FIG. 16 is a schematic structural view of a bonding enhancement structure according to another embodiment of the present disclosure.

In order to greatly enhance the bonding stability of the whole contact surface between the bonding enhancement structure 19 and the first electrode structure 14, reference is made to FIG. 16, which is a schematic structural view of a bonding enhancement structure according to another embodiment of the present disclosure. There is one electrical contact unit between adjacent bonding enhancement units 74, such that the bonding enhancement units 74 and the electrical contact unit are arranged uniformly, and thus the bonding stability of the contact surface is uniformly enhanced via the bonding enhancement units 74.

It should be noted that both the bonding enhancement units 74 and the electrical contact units may be arranged in other manners, which is not limited in the embodiment of the present disclosure. The above is only illustrated as an example.

It can be seen from the above description that, the bonding enhancement units 74 are arranged in the strip-shaped grooves 73 in various manners, such that the bonding stability of the contact surface between the bonding enhancement structure 19 and the first electrode structure 14 can be enhanced, and the risk of the LED unit 15 peeling off during multiple bending can be further reduced.

Figure 17:
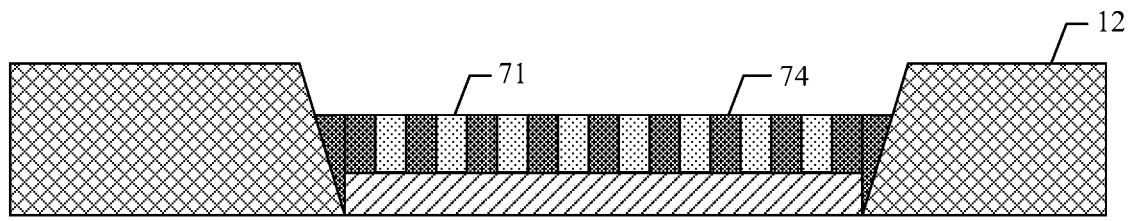
FIG. 17 is a schematic structural view of a bonding enhancement structure according to another embodiment of the present disclosure.

Further, reference is made to FIG. 17, which is a schematic structural view of a bonding enhancement structure according to another embodiment of the present disclosure. The bonding enhancement units 74 located between the pixel definition layer 12 and the electrical contact layer 71 covers a side wall of the first electrode structure 14 in a direction perpendicular to the flexible substrate 11.

Since the bonding enhancement structure 19 easily peels off from the first electrode structure 14 at the edge during bending, the bonding enhancement unit 74 located outside the electrical contact layer 71 extends to the planarization layer 28, to complete cover the side wall of the first electrode structure 14. In this way, the bonding stability between the bonding enhancement structure 19 and the first electrode structure 14 can be further enhanced, and the risk of the LED unit peeling off during multiple bending can be greatly reduced.

In addition, the bonding enhancement unit 74 may be made of a material having an elastic coefficient close to that of the organic material layer adjacent to the bonding enhancement unit 74, such that the bonding enhancement unit is stably bonded with the adjacent organic material layer.

In can be seen from the above description that, in the embodiments of the present disclosure, the bonding enhancement structure is arranged between the LED unit and the first electrode structure in various manners, which not only can buffer the stress generated by the first electrode structure during bending, but also can enhance a bonding force between the bonding enhancement structure and the first electrode structure. In addition, by combining structures for buffering the stress with structures for enhancing the bonding force in various manners, the stability between the LED unit and the first electrode structure can be further improved, and the risk of peeling off can be minimized.

Figure 18:
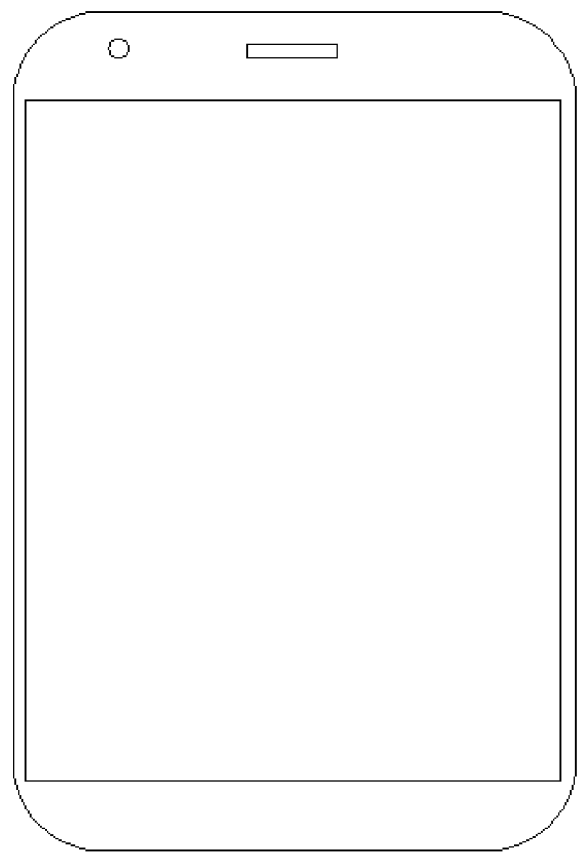
FIG. 18 is a schematic structural view of an electronic device according to an embodiment of the present disclosure.

Based on the flexible LED display panel provided in the present disclosure, an electronic device is further provided in the present disclosure. Reference is made to FIG. 18, which is a schematic structural view of an electronic device according to an embodiment of the present disclosure. The electronic device includes the flexible LED display panel described above.

The electronic device may be but is not limited to a tablet or a mobile phone.

The flexible LED display panel is applied in the electronic device, so that the LED unit does not easily peel off, and the display effect and service life of the electronic device can be greatly improved.

It should be noted that the embodiments in this specification are described in a progressive manner, each of the embodiments emphasizes differences from other embodiments, and the same or similar parts among the embodiments can be referred to each other.

It should further be noted that relationship terminologies herein such as "first", "second" are only used to distinguish one entity or operation from another entity or operation, rather than necessitating or implying an actual relationship or order between the entities or operations. Furthermore, terms such as "include", "comprise" or any other variations thereof are intended to be non-exclusive. Therefore, an article or device including a series of elements includes not only the elements but also other elements that are not enumerated, or further includes the elements inherent for the article or device. Unless expressively limited otherwise, an element defined by the statement "comprising (including) a . . . " does not exclude the case that the article or device including the element may include other similar elements.

The invention claimed is:

1. A flexible light emitting diode (LED) display panel, comprising:

a flexible substrate;

a pixel definition layer arranged on a side of the flexible substrate, comprising a plurality of openings arranged in an array;

a first electrode structure arranged at the bottom of the plurality of openings; and an LED unit arranged on a side of the first electrode structure facing away from the flexible substrate, the LED unit comprising a first conductive layer, a semiconductor layer and a second conductive layer stacked in sequence, wherein the first conductive layer is electrically connected to the first electrode structure via a bonding enhancement structure; and the bonding enhancement structure is configured to buffer a stress generated by the first electrode structure during bending.

2. The flexible LED display panel according to claim 1, wherein the bonding enhancement structure is an electrical contact layer, and
the flexible LED display panel has at least one bending region, and the electrical contact layer in the bending region is provided with hollowed regions.

3. The flexible LED display panel according to claim 2, wherein the hollowed regions are through holes penetrating through the electrical contact layer.

4. The flexible LED display panel according to claim 2, wherein the hollowed regions are a plurality of strip-shaped grooves arranged in parallel, and the plurality of strip-shaped grooves is arranged to divide the electrical contact layer into a plurality of electrical contact units arranged in parallel, with the plurality of strip-shaped grooves being between adjacent electrical contact units among the plurality of electrical contact units.

5. The flexible LED display panel according to claim 1, wherein the flexible LED display panel has at least one bending region, and the bonding enhancement structure in the bending region comprises an electrical contact layer and one or more bonding enhancement units, and
the one or more bonding enhancement units are configured to buffer a stress generated by the first electrode structure during bending.

6. The flexible LED display panel according to claim 5, wherein the bonding enhancement units are arranged on two sides of the electrical contact layer, and the electrical contact layer is an integral structure.

7. The flexible LED display panel according to claim 5, wherein the bonding enhancement units are arranged on two sides of the electrical contact layer, and the electrical contact layer is provided with through holes penetrating through the electrical contact layer.

8. The flexible LED display panel according to claim 5, wherein the electrical contact layer is provided with a plurality of strip-shaped grooves arranged in parallel, and the plurality of strip-shaped grooves is arranged to divide the electrical contact layer into a plurality of electrical contact units arranged in parallel, with the plurality of strip-shaped grooves being between adjacent electrical contact units among the plurality of electrical contact units.

9. The flexible LED display panel according to claim 8, wherein the bonding enhancement units are arranged on two sides of the electrical contact layer, and an extension direction of each of the plurality of strip-shaped grooves is perpendicular to a direction in which the bonding enhancement units are relatively arranged.

10. The flexible LED display panel according to claim 8, wherein the bonding enhancement units are arranged in the plurality of strip-shaped grooves, with at least one of the plurality of electrical contact units being between adjacent bonding enhancement units among the bonding enhancement units.

11. The flexible LED display panel according to claim 5, wherein the bonding enhancement units are arranged on two sides of the electrical contact layer, and the bonding enhancement units located between the pixel definition layer and the electrical contact layer cover a side wall of the first electrode structure in a direction perpendicular to the flexible substrate.

12. The flexible LED display panel according to claim 2, wherein the electrical contact layer is made of a material which is the same as that of the first electrode structure.

13. The flexible LED display panel according to claim 5, wherein the bonding enhancement units are made of non-conductive materials; and
the bonding enhancement units are made of an organic material or a high molecular polymer material.

14. The flexible LED display panel according to claim 1, wherein in a direction perpendicular to the flexible substrate, an area covered by the bonding enhancement structure is the same as an area covered by the first electrode structure.

* * * * *